US011133311B2

(12) United States Patent
Bhuwalka et al.

(10) Patent No.: US 11,133,311 B2
(45) Date of Patent: Sep. 28, 2021

(54) SEMICONDUCTOR DEVICE

(71) Applicant: SAMSUNG ELECTRONICS CO., LTD., Suwon-si (KR)

(72) Inventors: Krishna Kumar Bhuwalka, Suwon-si (KR); Kyoung Min Choi, Seoul (KR); Takeshi Okagaki, Hwaseong-si (KR); Dong Won Kim, Seongnam-si (KR); Jong Chol Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/358,989

(22) Filed: Mar. 20, 2019

(65) Prior Publication Data
US 2020/0066725 A1    Feb. 27, 2020

(30) Foreign Application Priority Data

Aug. 27, 2018 (KR) .......... 10-2018-0100509

(51) Int. Cl.
*H01L 27/092*    (2006.01)
*H01L 29/78*     (2006.01)
(Continued)

(52) U.S. Cl.
CPC ...... *H01L 27/0928* (2013.01); *H01L 29/0673* (2013.01); *H01L 29/1033* (2013.01);
(Continued)

(58) Field of Classification Search
CPC ......... H01L 29/78696; H01L 29/42392; H01L 29/0673; H01L 27/0673; H01L 27/0928; H01L 21/823828
See application file for complete search history.

(56) References Cited

U.S. PATENT DOCUMENTS 9,666,492 B2    5/2017  Radosavljevic et al.
9,929,160 B1    3/2018  Lee et al.
(Continued)

FOREIGN PATENT DOCUMENTS

CN    107154433 A    9/2017

OTHER PUBLICATIONS

N. Loubet, et. al. "Stacked Nanosheet Gate-all-around transistor to Enable Scaling beyond FinFET", Conference: 2017 Symposium on VLSI Technology.

*Primary Examiner* — Sarah K Salerno
(74) *Attorney, Agent, or Firm* — Lee IP Law, P.C.

(57) ABSTRACT

A semiconductor device includes channel layers on a substrate, the channel layers being spaced apart from each other, and having first side surfaces and second side surfaces opposing each other in a first direction, a gate electrode surrounding the channel layers and having a first end portion and a second end portion, opposing each other in the first direction, and a source/drain layer on a first side of the gate electrode and in contact with the channel layers, a portion of the source/drain layer protruding further than the first end portion of the gate electrode in the first direction, wherein a first distance from the first end portion of the gate electrode to the first side surfaces of the channel layers is shorter than a second distance from the second end portion of the gate electrode to the second side surfaces of the channel layers.

20 Claims, 11 Drawing Sheets

(51) Int. Cl.
*H01L 29/423* (2006.01)
*H01L 29/10* (2006.01)
*H01L 29/06* (2006.01)

(52) U.S. Cl.
CPC .. *H01L 29/42356* (2013.01); *H01L 29/42392* (2013.01); *H01L 29/7854* (2013.01)

(56) References Cited

U.S. PATENT DOCUMENTS

| | | |
|---|---|---|
| 2016/0027870 A1 | 1/2016 | Cheng et al. |
| 2016/0358932 A1 | 12/2016 | Yang |
| 2017/0040321 A1 | 2/2017 | Mitard |
| 2017/0110595 A1* | 4/2017 | Sengupta .......... H01L 29/66545 |
| 2017/0117359 A1* | 4/2017 | Cheng ................ H01L 29/0673 |
| 2017/0179248 A1* | 6/2017 | Pawlak ................ H01L 29/775 |
| 2017/0220595 A1* | 8/2017 | Hakami ................ G06F 16/248 |
| 2017/0236900 A1* | 8/2017 | Chang ................ H01L 29/6653 257/347 |
| 2017/0256609 A1 | 9/2017 | Bhuwalka et al. |
| 2020/0294866 A1* | 9/2020 | Cheng ................ H01L 29/0673 |

* cited by examiner

SEMICONDUCTOR DEVICE

CROSS-REFERENCE TO RELATED APPLICATION

Korean Patent Application No. 10-2018-0100509, filed on Aug. 27, 2018, in the Korean Intellectual Property Office, and entitled: "Semiconductor Device," is incorporated by reference herein in its entirety.

BACKGROUND

1. Field

The present disclosure relates to a semiconductor device, and more particularly, to a semiconductor device having a plurality of channel layers stacked vertically.

2. Description of the Related Art

A gate-all-around transistor has been proposed as an element to implement a scaling technique to increase the density of semiconductor devices. A gate-all-around transistor may include a plurality of active patterns on a substrate in the form of a nanowire or a nanosheet and a gate electrode to cover surfaces of the active patterns.

SUMMARY

According to an example embodiment, a semiconductor device may include a plurality of channel layers stacked on a substrate to be spaced apart from each other and having first side surfaces and second side surfaces, opposing each other in one direction, a gate electrode to surround the plurality of channel layers and having a first end portion and a second end portion, opposing each other in the one direction, and a source/drain layer on one side of the gate electrode to be in contact with the plurality of channel layers. A portion of the source/drain layer protrudes further than the first end portion of the gate electrode in the one direction. In the one direction, a first distance from the first end portion of the gate electrode to the first side surfaces of the plurality of channel layers is shorter than a second distance from the second end portion of the gate electrode to the second side surfaces of the plurality of channel layers.

According to an example embodiment, a semiconductor device may include a gate electrode on a substrate, the gate electrode having a first end portion and a second end portion, opposing the first end portion, in one direction, a plurality of nanosheets on the substrate to be spaced apart from each other, the plurality of nanosheets penetrating the gate electrode and having first side surfaces and second side surfaces, opposing the first side surfaces, in the one direction, a source/drain layer on one side of the gate electrode to be in contact with the plurality of nanosheets, and a gate isolation portion adjacent to the first end portion of the gate electrode. A portion of the source/drain layer protrudes further than the first end portion of the gate electrode in the one direction, and a portion of the gate isolation portion and a portion of the source/drain layer overlap each other horizontally. In the one direction, a first distance from the first end portion of the gate electrode to the first side surfaces of the plurality of nanosheets is shorter than a second distance from the second end portion of the gate electrode to the second side surfaces of the plurality of nanosheets.

According to an example embodiment, a semiconductor device may include a first active region extending in a first direction, a plurality of first channel layers stacked on the first active region to be spaced apart from each other, the plurality of first channel layers having first side surfaces and second side surfaces, opposing each other in a second direction, perpendicular to the first direction, a first gate electrode to surround the plurality of first channel layers and having a first end portion and a second end portion, opposing the first end portion, in the second direction, a first source/drain layer on one side of the gate electrode to be in contact with the plurality of first channel layers, a second active region extending in the first direction, a plurality of second channel layers on the second active region to be spaced apart from each other, the plurality of second channel layers having third side surfaces and fourth side surfaces, opposing each other in the second direction, a second gate electrode to surround the plurality of second channel layers and having a third end portion and a fourth end portion, opposing the third end portion, in the second direction, and a second source/drain layer on one side of the second gate electrode to be in contact with the plurality of second channel layers. At least a portion of the first source/drain layer protrudes further than the first end portion of the first gate electrode in the second direction, and at least a portion of the second source/drain layer protrudes further than the third end portion of the second gate electrode in the second direction.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, example embodiments will be described with reference to the accompanying drawings.

Figure 1:
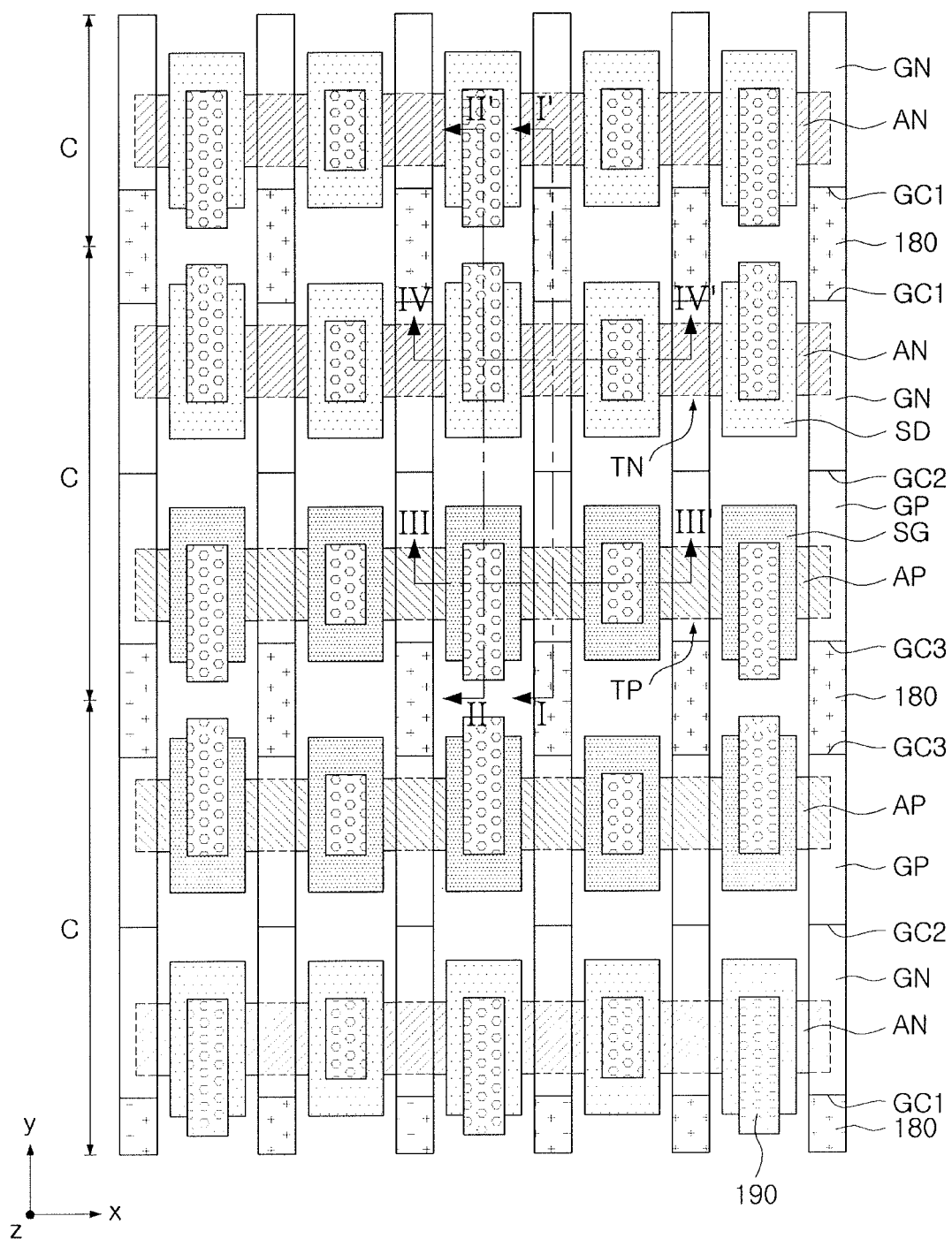
FIG. 1 illustrates a layout of a semiconductor device according to an example embodiment.
Figure 2:
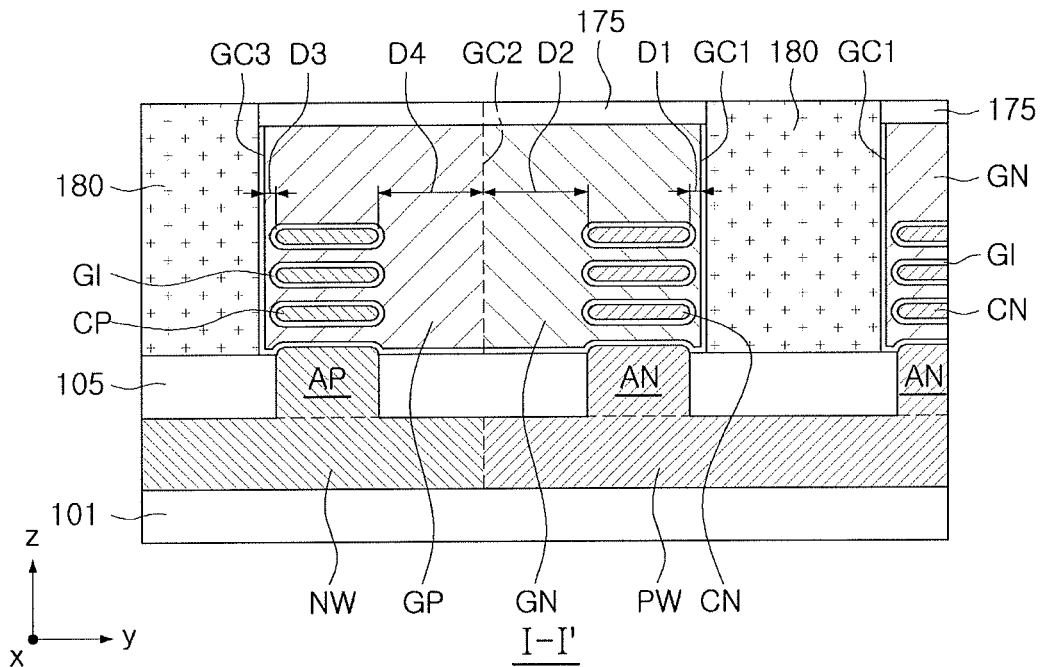
FIGS. 2 to 4 illustrate cross-sectional views of a semiconductor device according to an example embodiment.
Figure 3:
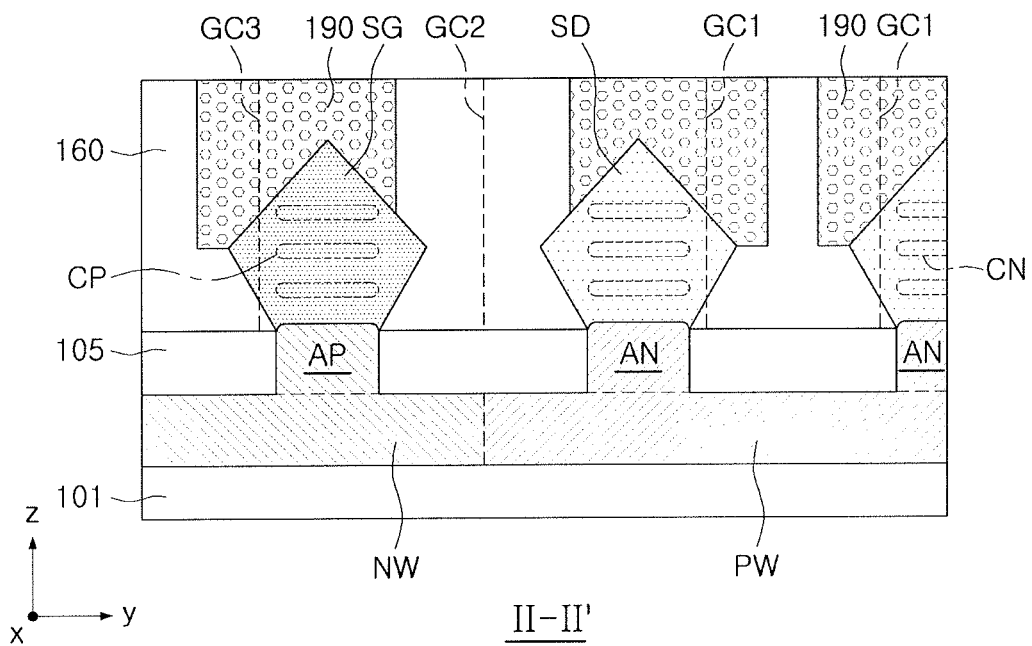
Figure 4:
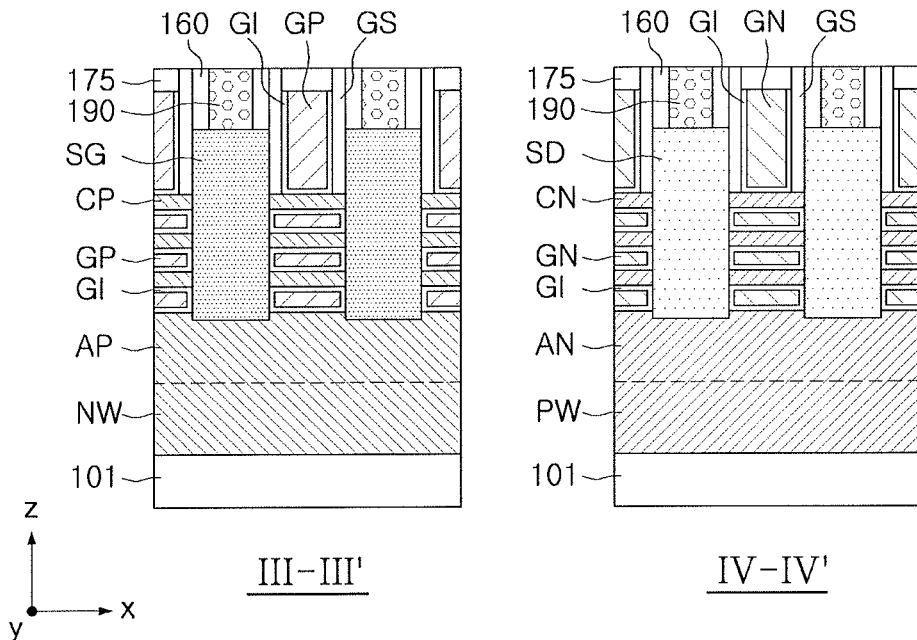

FIG. 1 is a layout of a semiconductor device according to an example embodiment. FIGS. 2 to 4 are cross-sectional views of the semiconductor device in FIG. 1. FIG. 2 is a cross-sectional view taken along line I-I' in FIG. 1, FIG. 3 is a cross-sectional view taken along line II-II' in FIG. 1, and FIG. 4 is a cross-sectional view taken along line III-III' in FIG. 1.

Referring to FIG. 1, a semiconductor device according to an example embodiment may include logic standard cells C provided on a substrate. Each of the logic standard cells C includes N-type transistors TN and P-type transistors TP.

The logic standard cell C may include a first active region AN extending in a first direction, e.g., in the x direction, first gate electrodes GN extending in a second direction, e.g., in the y direction, to intersect the first active region AN, first source/drain layers SD disposed between the first gate electrodes GN, a second active region AP extending in the first direction, e.g., in the x direction, second gate electrodes GP extending in the second direction, e.g., in the y direction, to intersect the second active region AP, and second source/drain layers SG disposed between the second gate electrodes GP.

The N-type transistor TN includes the first active region AN, the first gate electrode GN, and the first source/drain layers SD. The P-type transistor TP includes the second active region AP, the second gate electrode GP, and the second source/drain layers SG.

The semiconductor device may further include gate isolation portions 180 disposed between the first gate electrodes GN, e.g., between first gate electrodes GN adjacent to each other in the y direction, and between the second gate electrodes GP e.g., between second gate electrodes GP adjacent to each other in the y direction. The semiconductor device may further include contact plugs 190 connected to the first source/drain layers SD and the second source/drain layers SG.

The gate isolation portions 180 may be disposed adjacent to first end portions GC1 of the first gate electrodes GN, and adjacent to third end portions GC3 of the second gate electrodes GP. The first gate electrode GN may have second end portions opposing the first end portions GC1, and the second gate electrodes GP may have fourth end portions opposing the third end portions GC3. The second end portions of the first gate electrodes GN and the fourth end portions of the second gate electrode GP may be brought in contact with each other to form contact portions GC2. Accordingly, it will be appreciated that the contact portion GC2 is the same as the second end portion and the fourth end portion.

Referring to FIG. 2, the semiconductor device may further include a substrate 101 in which a first well region PW and a second well region NW are formed. In the substrate 101, the first active region AN protrudes from the first well region PW, the second active region AP protrudes from the second well region NW, and a device isolation layer 105 is between the first active region AN and the second active region AP, and between adjacent first active regions AN and between adjacent second active regions AP. Further, first channel layers CN may be disposed on the first active region AN at predetermined intervals, second channel layers CP may be disposed on the second active region AP at predetermined intervals, the first gate electrode GN may be disposed to cover, e.g., surround, the first channel layers CN, the second gate electrode GP may be disposed to cover, e.g., surround, the second channel layers CP, and a gate insulating layer GI may be disposed between the first gate electrode GN and the first channel layers CN and between the second gate electrode GP and the second channels CP. The gate isolation portions 180 may be disposed in contact with the first end portion GC1 of the first gate electrode GN and the third end portion GC3 of the second gate electrode GP. A gate capping layer 175 may be disposed on the first gate electrode GN and the second gate electrode GP.

The substrate 101 may include semiconductor materials, e.g., silicon, germanium, and silicon-germanium or III-V group compounds, e.g., GaAs, AlGaAs, InAs, InGaAs, InSb, GaSb, InGaSb, InP, GaP, InGaP, InN, GaN, and InGaN. In some embodiments, the substrate 101 may be a silicon-on-insulator (SOI) substrate or a germanium-on-insulator (GOI) substrate.

The first well region PW, the first active region AN, and the first channel layer CN may include P-type dopants. The second well region NW, the second active region AP, and the second channel layer CP may include N-type dopants.

The first channel layers CN and the second channel layers CP may be nanosheets, each having widths, e.g., in the x and y direction, greater than the thickness thereof, e.g., in the z direction. Each of the first and second channel layers CN and CP may have a width ranging from about 10 nm to about 50 nm in the second direction, e.g., in the y direction. The first channel layers CN may have first side surfaces and second side surfaces, opposing each other, in the second direction, e.g., in the y direction, and the second channel layers CP may have third side surfaces and fourth side surfaces, opposing each other, in the second direction, e.g., in the y direction. The first side surfaces and the second side surfaces of the first channel layers CN may have curved surfaces, and the third side surfaces and the fourth side surfaces of the second channel layers CP may have curved surfaces.

The first channel layers CN and the second channel layers CP may include a semiconductor material, e.g., silicon, germanium or the like. The number of the first channel layers CN and the number of the second channel layers CP are not limited to those shown in the drawings.

The first gate electrode GN may also be disposed between the first active region AN and the first channel layer CN. The second gate electrode GP may also be disposed between the second active region AP and the second channel layer CP. The first gate electrode GN and the second gate electrode GP may extend to the device isolation layer 105 in the second direction, e.g., in the y direction. The first gate electrode GN and the second gate electrode GP may be in contact with each other between the first active region AN and the second active region AP to form the contact portion GC2 (dashed line in FIG. 2). The contact portion GC2 may be a second end portion of the first gate electrode GN or a fourth end portion of the second gate electrode GP.

The first gate electrode GN may have the first end portion GC1 and the second end portion, opposing each other, in the second direction, e.g., in the y direction. The second gate electrode GP may have the third end portion GC3 and the fourth end portion, opposing each other, in the second direction, e.g., the y direction.

The first end portion GC1 of the first gate electrode GN may be disposed in such a manner that the first channel layers CN are entirely covered with the first gate electrode GN. The third end portion GC3 of the second gate electrode GP may be disposed in such a manner that the second channel layers CP are entirely covered with the second gate electrode GP.

A first distance D1 from the first end portion GC1 of the first gate electrode GN to the first side surfaces of the first channel layers CN may be shorter than a second distance D2 from the second end portion of the first gate electrode GN to the second side surfaces of the first channel layers CN. The first distance D1 may be less than half a width of each of the first channel layers CN in the second direction, e.g., the y direction. A third distance D3 from the third end portion GC3 of the second gate electrode GP to the third side surfaces of the second channel layers CP may be shorter than a fourth distance D4 from the fourth end portion of the second gate electrode GP to the fourth side surfaces of the second channel layers CP. The third distance D3 may be less than half a width of each of the second channel layers CP in the second direction, e.g., the y direction.

The first distance D1 may be about 3 nanometers (nm) or less. The first distance D1 and the third distance D3 may be equal to each other, and the second distance D2 and the fourth distance D4 may be equal to each other.

The first gate electrode GN and the second gate electrode GP may include work function materials different from each other to adjust threshold voltages of N-type and P-type transistors TN and TP. The work function material may include at least one of, e.g., titanium nitride (TiN), titanium aluminum (TiAl), titanium aluminum nitride (TiAlN), tantalum nitride (TaN), tantalum aluminum nitride (TaAlN), titanium aluminum carbide (TiAlC), and tungsten nitride (WN).

The gate insulating layer GI may also be disposed between the first gate electrode GN and the first active region AN, between the first gate electrode GN and the device isolation layer 105, and between the first end portion GC1 of the first gate electrode GN and the gate isolation portion 180. The gate insulating layer GI may also be disposed between the second gate electrode GP and the second active region AP, between the second gate electrode GP and the device isolation layer 105, and between the third end portion GC3 of the second gate electrode GP and the gate isolation portion 180.

The gate insulating layer GI may include, e.g., a silicon oxide, a silicon nitride, a silicon oxynitride or a high-k dielectric material. The high-k dielectric material may refer to a dielectric material having a dielectric constant higher than a dielectric constant of a silicon oxide layer ($SiO_2$). The high-k dielectric material may one of, e.g., aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), Lanthanum hafnium oxide ($LaHf_xO_y$), hafnium aluminum oxide ($HfAl_xO_y$), and praseodymium oxide ($Pr_2O_3$).

An interfacial insulating layer may be disposed between the first channel layers CN and the gate insulating layer GI and between the second channel layer CP and the gate insulating layer GI. The interfacial insulating layer may include an oxide, e.g., a silicon oxide.

Referring to FIGS. 3 and 4, first source/drain layers SD may be disposed on the first active region AN extending in a first direction, e.g., the x direction, and second source/drain layers SG may be disposed on the second active region AP extending in the first direction, e.g., the x direction. First channel layers CN may be disposed between the first source/drain layers SD, and the first source/drain layers SD may be in contact with the first channel layers CN. Second channel layers CP may be disposed between the second source/drain layers SG, and the second source/drain layers SG may be in contact with the second channel layers CP.

Gate spacers GS may be disposed on sidewalls of the first gate electrode GN and sidewalls of the second gate electrode GP. The gate spacers GS may be formed of an insulating material. A gate capping layer 175 disposed to cover the first gate electrode GN and the second gate electrode GP may include a nitride, e.g., a silicon nitride.

Contact plugs 190 may be disposed on the first source/drain layers SD and the second source drain layers SG. The contact plugs 190 may penetrate an interlayer dielectric 160 to be in contact with the first source/drain layers SD and the second source/drain layers SG. The interlayer dielectric 160 may include, for example, a silicon oxide, e.g., tetraethyl orthosilicate (TEOS).

A portion of the first source/drain layer SD may protrude further than a first end portion GC1 of the first gate electrode GN in the second direction, e.g., the y direction. A portion of the second source/drain layer SG may protrude further than a third end portion GC3 of the second gate electrode GP in the second direction, e.g., the y direction.

FIGS. 5 to 10 are cross-sectional views according to example embodiments of the present disclosure, corresponding to FIG. 2. Since the semiconductor devices are similar to the semiconductor device described with reference to FIG. 2, detailed descriptions of the same elements as those shown in FIG. 2 will be omitted.

Figure 5:
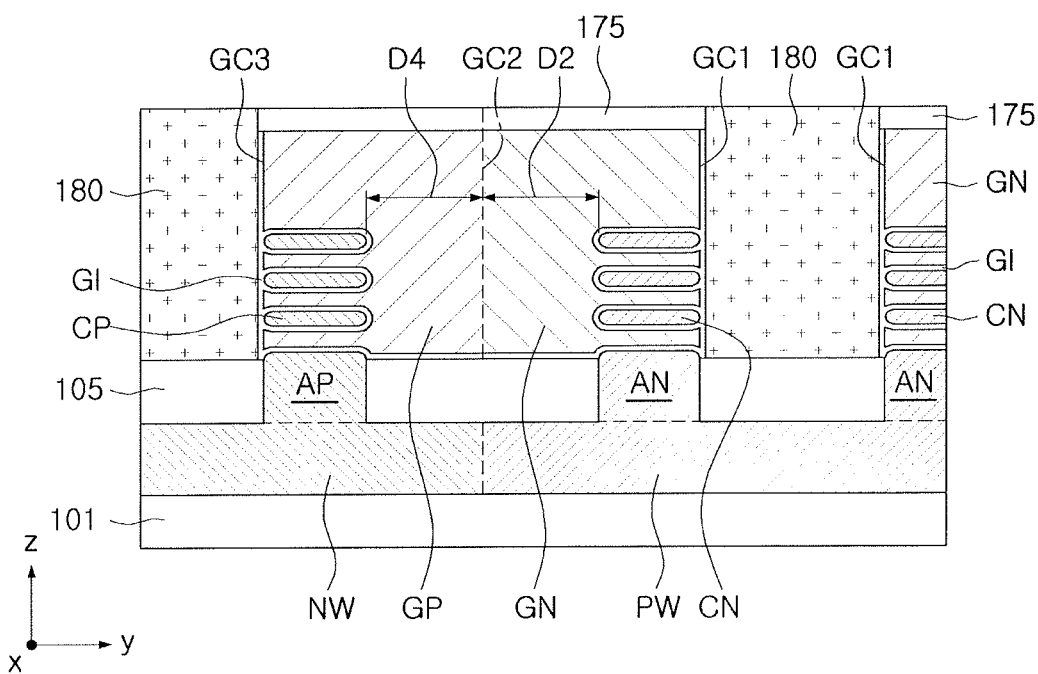
FIGS. 5 to 10 illustrate cross-sectional views of semiconductor devices according to example embodiments.

Referring to FIG. 5, in the semiconductor device, a first end portion GC1 of the first gate electrode GN may be aligned with first side surfaces of first channel layers CN. For example, a first distance from the first end portion GC1 of the first gate electrode GN to the first side surfaces of the first channel layers CN is 0 nm. A third end portion GC3 of the second gate electrode GP may be aligned with third side surfaces of the second channel layers CP. For example, a third distance from the third end portion GC3 of the second gate electrode GP to the third sidewalls of the second of the second channel layers CP is 0 nm.

Figure 6:
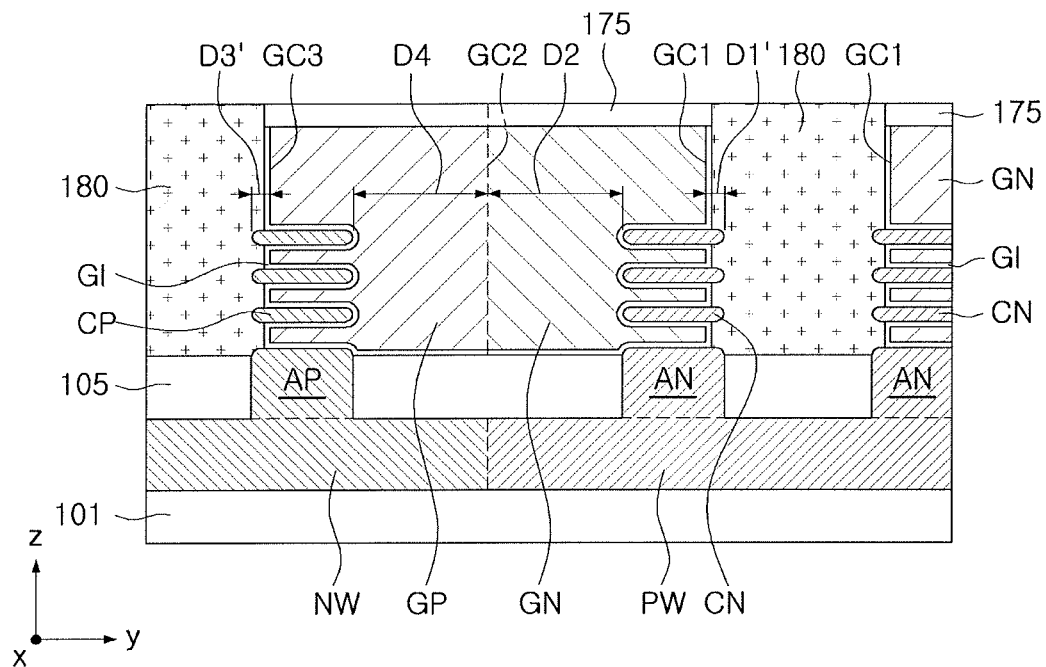

Referring to FIG. 6, in the semiconductor device, first side surfaces of the first channel layers CN may protrude further than a first end portion GC1 of the first gate electrode GN, e.g., first side surfaces of the first channel layers CN may extend along the y direction beyond the first gate electrode GN into the gate isolation portion 180. For example, a first distance D1' from the first end portion GC1 of the first gate electrode GN to the first side surfaces of the first channel layers CN, e.g., within the gate isolation portion 180, may be about 3 nm or less. The first distance D1' may be shorter than the second distance D2. The third side surfaces of the second channel layers CP may protrude further than a third end portion GC3 of the second gate electrode GP, e.g., third side surfaces of the second channel layers CP may extend along the y direction beyond the second gate electrode GP into the gate isolation portion 180. For example, a third distance D3' from the third end portion GC3 of the second gate electrode GP to the third side surfaces of the second channel layers CP may be about 3 nm or less. The third distance D3' may be shorter than the fourth distance D4.

The first side surfaces of the first channel layers CN protruding further than the first end portion GC1 of the first gate electrode GN may have curved surfaces and may be in contact with the gate isolation portion 180. The gate isolation portion 180 may cover the first side surfaces of the first channel layers CN protruding further than the first end portion GC1 of the first gate electrode GN. The third side surfaces of the second channel layers CP protruding further than the third end portion GC3 of the second gate electrode GP may have curved surfaces and may be in contact with a gate isolation portion 180. The gate isolation portion 180 may cover the third side surfaces of the second channel layers CP protruding further than the third end portion GC3 of the second gate electrode GP.

Figure 7:
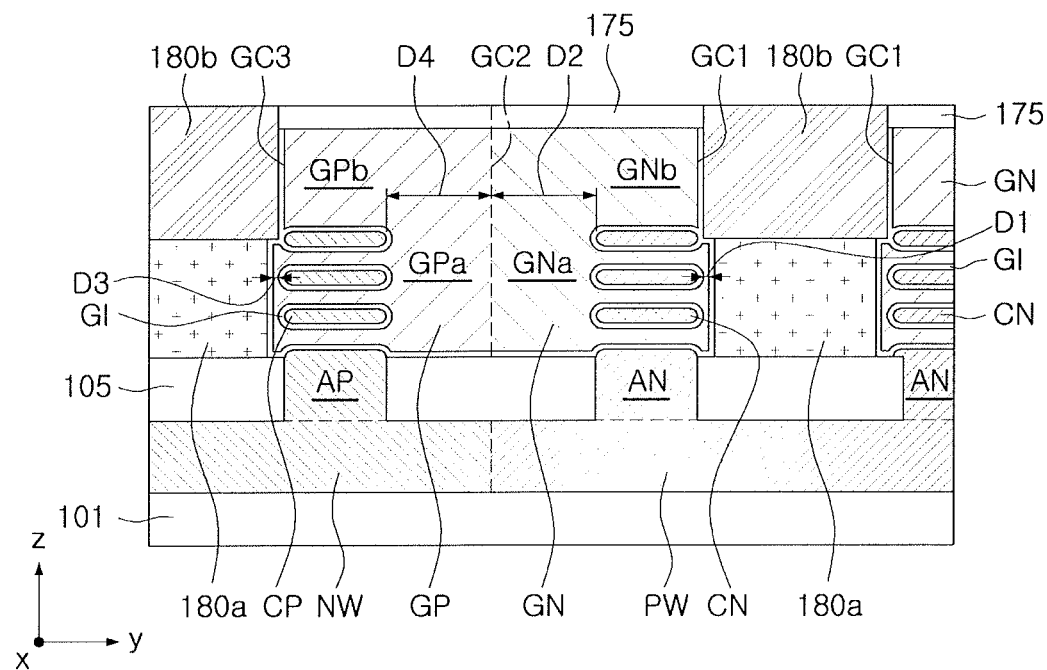

Referring to FIG. 7, in the semiconductor device, the first gate electrode GN may include a first lower electrode portion GNa and a first upper electrode portion GNb disposed on the first lower electrode portion GNa and extending less than the first lower electrode portion GNa in the second direction, e.g., the y direction. For example, as illustrated in FIG. 7, the first upper electrode portion GNb may be aligned with edges of the first channel layers CN, while the first lower electrode portion GNa may extend beyond the edges of the first channel layers CN in the y direction. The first upper electrode portion GNb may be disposed to cover, e.g., overlap, a portion of a first uppermost channel layer CN among the first channel layers CN, and the first lower electrode portion GNa may be disposed to cover the remaining channel layers CN. The first upper electrode portion GNb may not cover a portion of a first side surface of the first uppermost channel layer CN. A first end portion GC1 of the first upper electrode portion GNb may be aligned with a first side surface of the first uppermost channel layer CN. In the second direction, e.g., the y direction, the first distance D1 from a first end portion GC1 of the first lower electrode portion GNa to the first side surfaces of the first channel layers CN may be shorter than the second distance D2 from the second end portion GC2 of the first gate electrode GN to the second side surfaces of the first channel layers CN.

The second gate electrode GP may include a second lower electrode portion GPa and a second upper electrode portion GPb disposed on the second lower electrode portion GPa and extending less than the second lower electrode portion GPa in the second direction, e.g., the y direction. The second upper electrode portion GPb may be disposed to cover a portion of a second uppermost channel layer CP among the second channel layers CP, and the second lower electrode portion GPa may be disposed to cover the other second channel layers CP. The second upper electrode portion GPb may not cover a portion of a third surface of the second uppermost channel layer CP. A third end portion GC3 of the second upper electrode portion GPb may be aligned with the third side surface of the second uppermost channel layer CP. In the second direction, e.g., the y direction, a third distance D3 from a third end portion GC3 of the second lower electrode portion GPa to third side surfaces of the second channel layers CP may be shorter than a fourth distance D4 from a fourth end portion GC2 of the second gate electrode GP to fourth side surfaces of the second channel layers CP.

The gate isolation portion 180 may include a lower gate isolation portion 180a and an upper gate isolation portion 180b disposed on the lower gate isolation portion 180a and having a length greater than a length of the lower gate isolation portion 180a in the second direction, e.g., in the y direction. The first distance D1 may be equal to a length of a protrusion of the upper gate isolation portion 180b protruding from the lower gate isolation portion 180a, e.g., the first distance D1 may equal a length of a portion of the upper gate isolation portion 180b protruding beyond an edge of the lower gate isolation portion 180a in the second direction.

Figure 8:
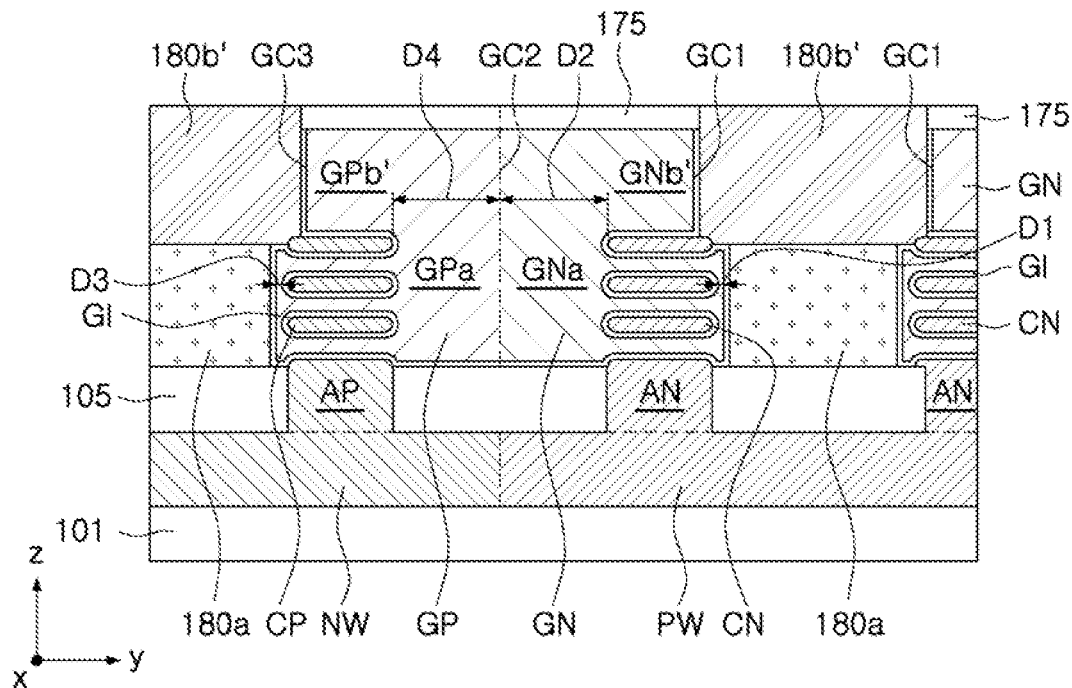

Referring to FIG. 8, in the semiconductor device, the first gate electrode GN may include the first lower electrode portion GNa and a first upper electrode portion GNb' disposed on the first lower electrode portion GNa and extending less than the first lower electrode portion GNa in the second direction, e.g., the y direction. The first upper electrode portion GNb' may extend less than the first upper electrode portion GNb in FIG. 7. A first side surface of the first uppermost channel layer CN may protrude further than the first upper electrode portion GNb' of the first gate electrode GN, and a lower region of the first side surface of the first uppermost channel layer CN may be covered with the first lower electrode portion GNa.

A second gate electrode GP may include a second lower electrode portion GPa and a second upper electrode portion GPb' disposed on the second lower electrode portion GPa and extending less than the second lower electrode portion GPa in the second direction, e.g., the y direction. The second upper electrode portion GPb' may extend less than the second upper electrode portion GPb in FIG. 7. A third side surface of the second uppermost channel layer CP may protrude further than the second upper electrode portion GPb' of the second gate electrode GP, and a lower region of the third side surface of the second uppermost channel layer CP may be covered with the second lower electrode portion GPa.

The gate isolation portion 180 may include the lower gate isolation portion 180a and an upper gate isolation portion 180b' having a width greater than a width of the lower gate isolation portion 180a in the second direction, e.g., the y direction. The width of the upper gate isolation portion 180b' may be greater than the width of the upper gate isolation portion 180b in FIG. 7. The upper gate isolation portion 180b' of the gate isolation portion 180 may be in contact with the first side surface of the first uppermost channel layer CN and the third surface of the second uppermost channel layer CP.

Figure 9:
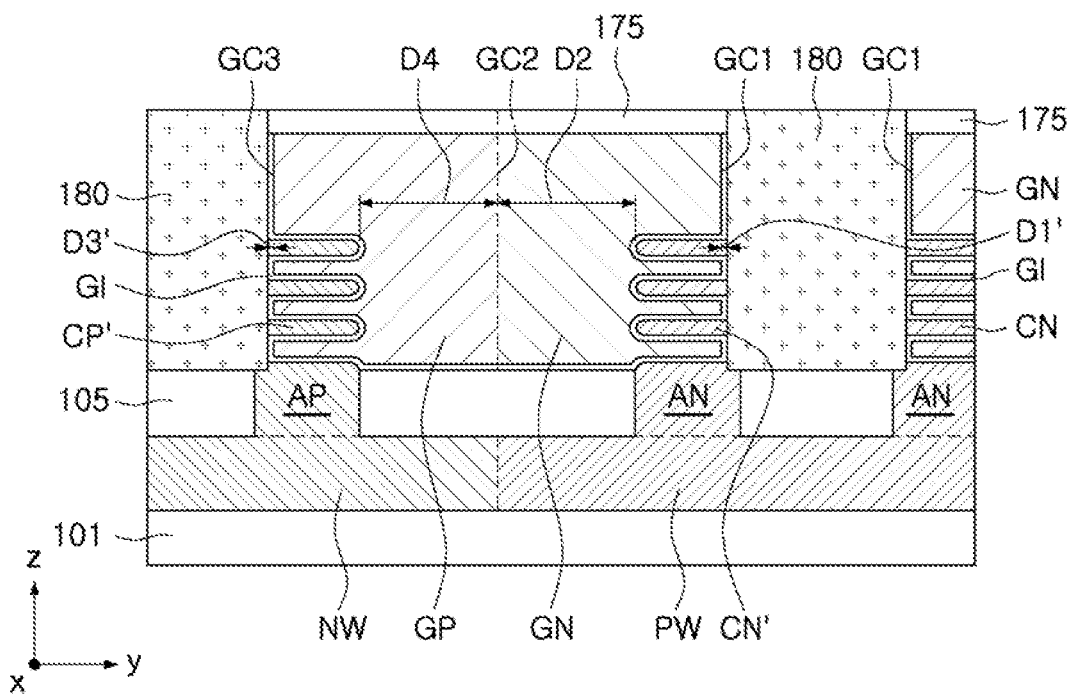

Referring to FIG. 9, first side surfaces of the first channel layers CN may protrude further than the first end portion GC1 of the first gate electrode GN. A first distance D1' from the first end portion GC1 of the first gate electrode GN to the first side surfaces of the first channel layers CN may be substantially equal to a thickness of the gate insulating layer GI. The first distance D1' may be shorter than a second distance D2. Third side surfaces of the second channel layers CP may protrude further than the third end portion GC3 of the second gate electrode GP. A distance D3' from the third end portion GC3 of the second gate electrode GP to the third side surfaces of the second channel layers CP may be substantially equal to the thickness of the gate insulating layer GI. The third distance D3' may be shorter than a fourth distance D4.

The first side surfaces of the first channel layers CN protruding further than the first end portion GC1 of the first gate electrode GN may be planes, e.g., flat, and may be in contact with the gate isolation portion 180. The third side surfaces of the second channel layers CP protruding further than the third end portion GC3 of the second gate electrode GP may be planes, e.g., flat, and may be in contact with the gate isolation portion 180.

Figure 10:
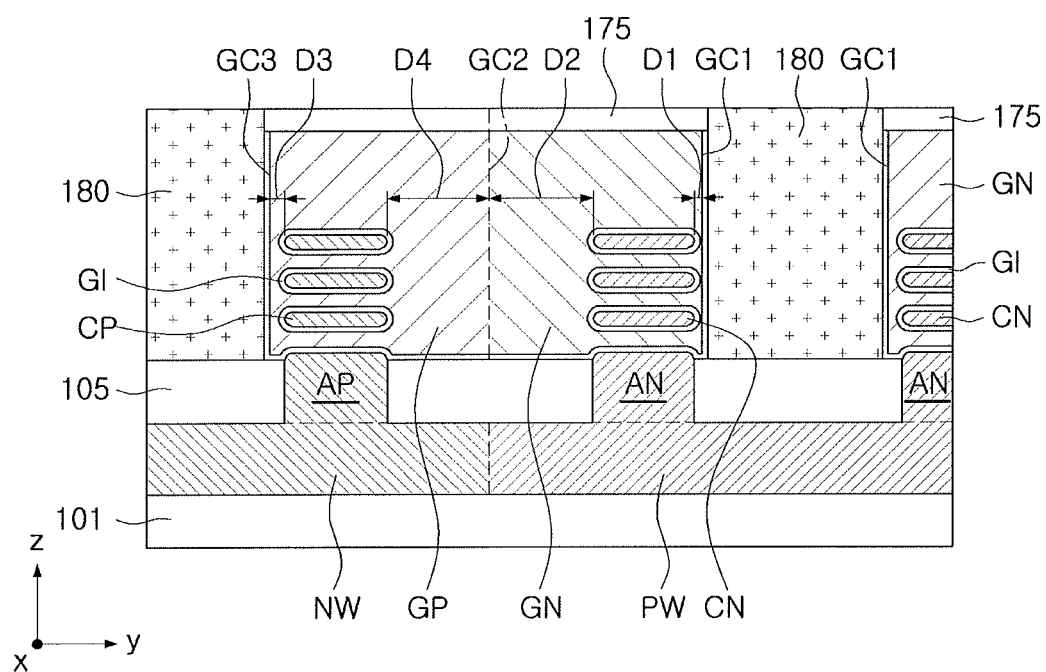

Referring to FIG. 10, the gate isolation portion 180 may be shifted to one side in the second direction, e.g., the y direction. To form the gate isolation portion 180, a structure may be formed as a photolithography process for forming an isolation hole that is misaligned. Unlike the semiconductor device in FIG. 2, a first distance D1 and a third distance D3 of the semiconductor device in FIG. 10 may be different from each other. In the case of the semiconductor device in FIG. 10, the first distance D1 may be shorter and the third distance D3 may be longer.

Figure 11:
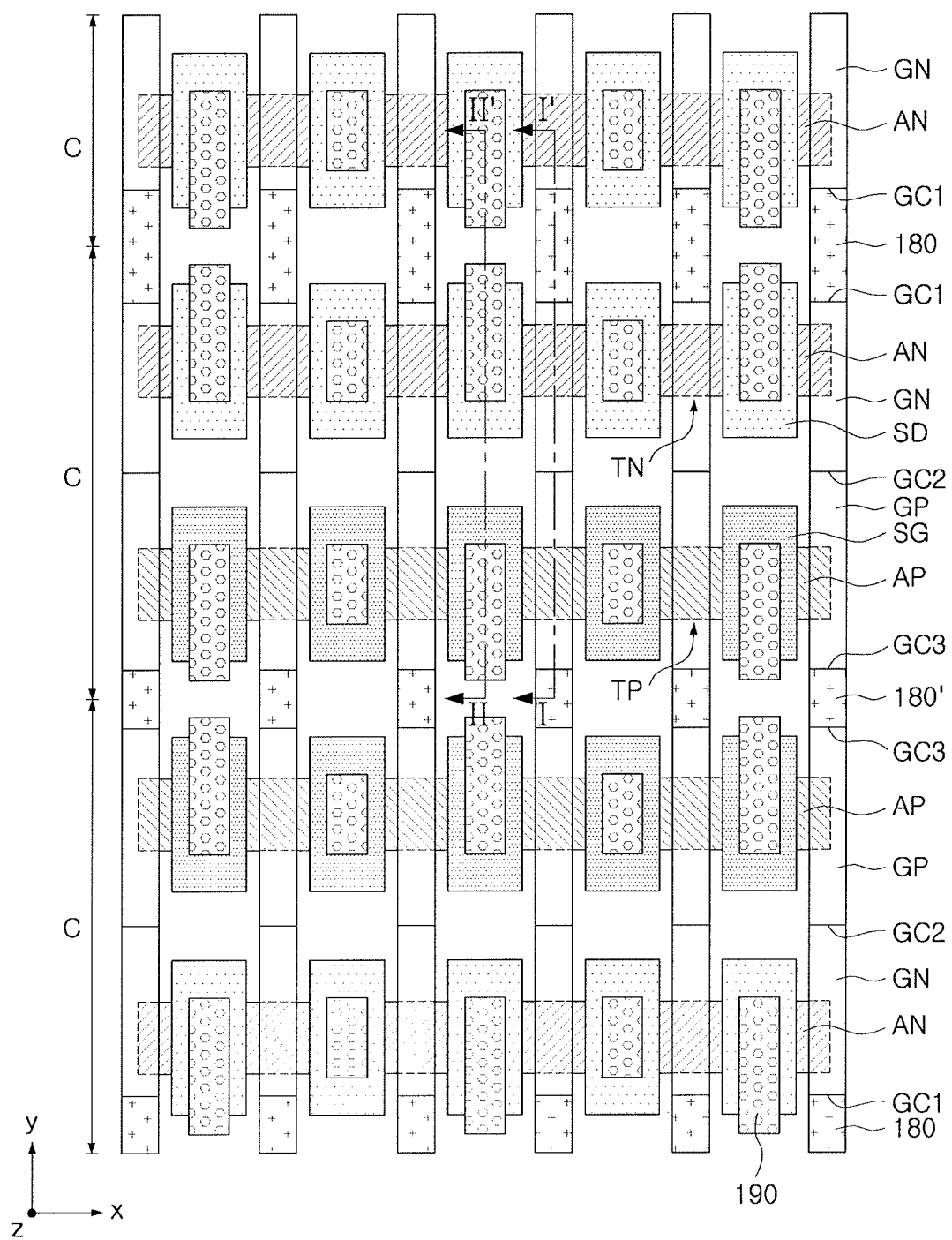
FIG. 11 illustrates a layout of a semiconductor device according to an example embodiment.
Figure 12:
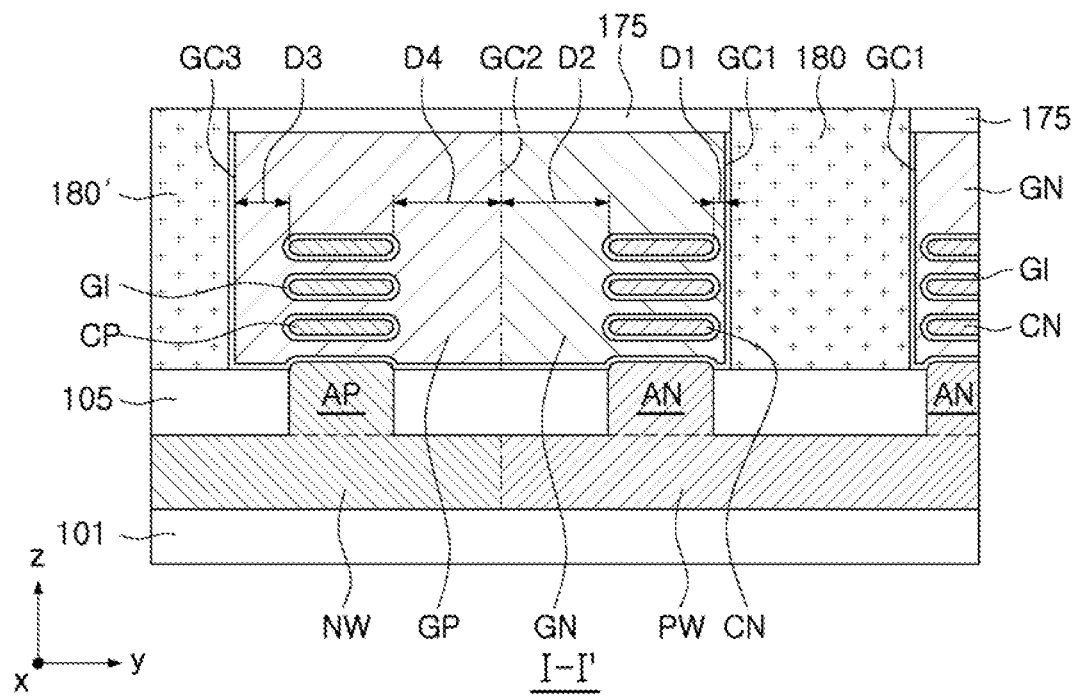
FIGS. 12 and 13 illustrate cross-sectional views of a semiconductor device according to an example embodiment.
Figure 13:
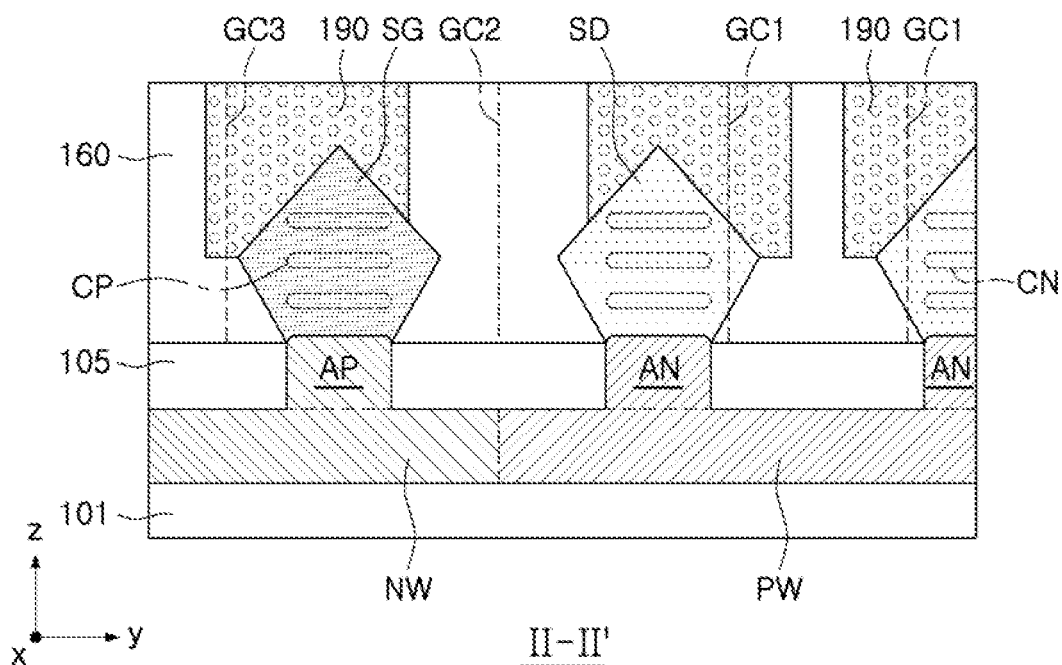

FIG. 11 is a layout of a semiconductor device according to an example embodiment. FIG. 12 is a cross-sectional view taken along line I-I' in FIG. 11, and FIG. 13 is a cross-sectional view taken along line II-II' in FIG. 11. Since the semiconductor device in FIGS. 11 to 13 is similar to the semiconductor device in FIGS. 1 to 4, detailed descriptions of the same elements as those shown in FIGS. 1 to 4 will be omitted.

Referring to FIGS. 11 to 13, a semiconductor device according to an example embodiment may include the gate isolation portions 180 disposed between the first gate electrodes GN and gate isolation portions 180' disposed between the second gate electrodes GP, in the second direction, e.g., the y direction. The gate isolation portion 180' may have a length shorter than a length of the gate isolation portion 180, in the second direction, e.g., in the y direction. The second gate electrode GP may have a length greater than a length of the first gate electrode GN, in the second direction, e.g., in the y direction.

Accordingly, the first distance D1 from the first end portion GC1 of the first gate electrode GN to the first side surfaces of first channel layers CN may not be equal to the third distance D3 from the third end portion GC3 of the second gate electrode GP to the third side surfaces of second channel layers CP. The third distance D3 may be longer than the first distance D1. The first distance D1 may be less than half a width of each of the first channel layers CN in the second direction, e.g., the y direction. The first distance D1 may be about 3 nm or less.

A portion of the first source/drain layer SD may protrude further than the first end portion GC1 of the first gate electrode GN, e.g., a horizontal edge of the first source/drain layer SD may extend beyond the first end portion GC1 (dashed line in FIG. 13) of the first gate electrode GN, while the second source/drain layer SG may not protrude further than the third end portion GC3 of the second gate electrode GP, e.g., a horizontal edge of the second source/drain layer SG may not reach the third end portion GC3 (dashed line in FIG. 13) of the second gate electrode GP. For example, as illustrated in FIG. 1, the gate isolation portion 180 may horizontally overlap a portion the first source/drain layer SD (as viewed in a top view), while the gate isolation portion 180' may not horizontally overlap the second source/drain layer SG (as viewed in a top view).

Figure 14:
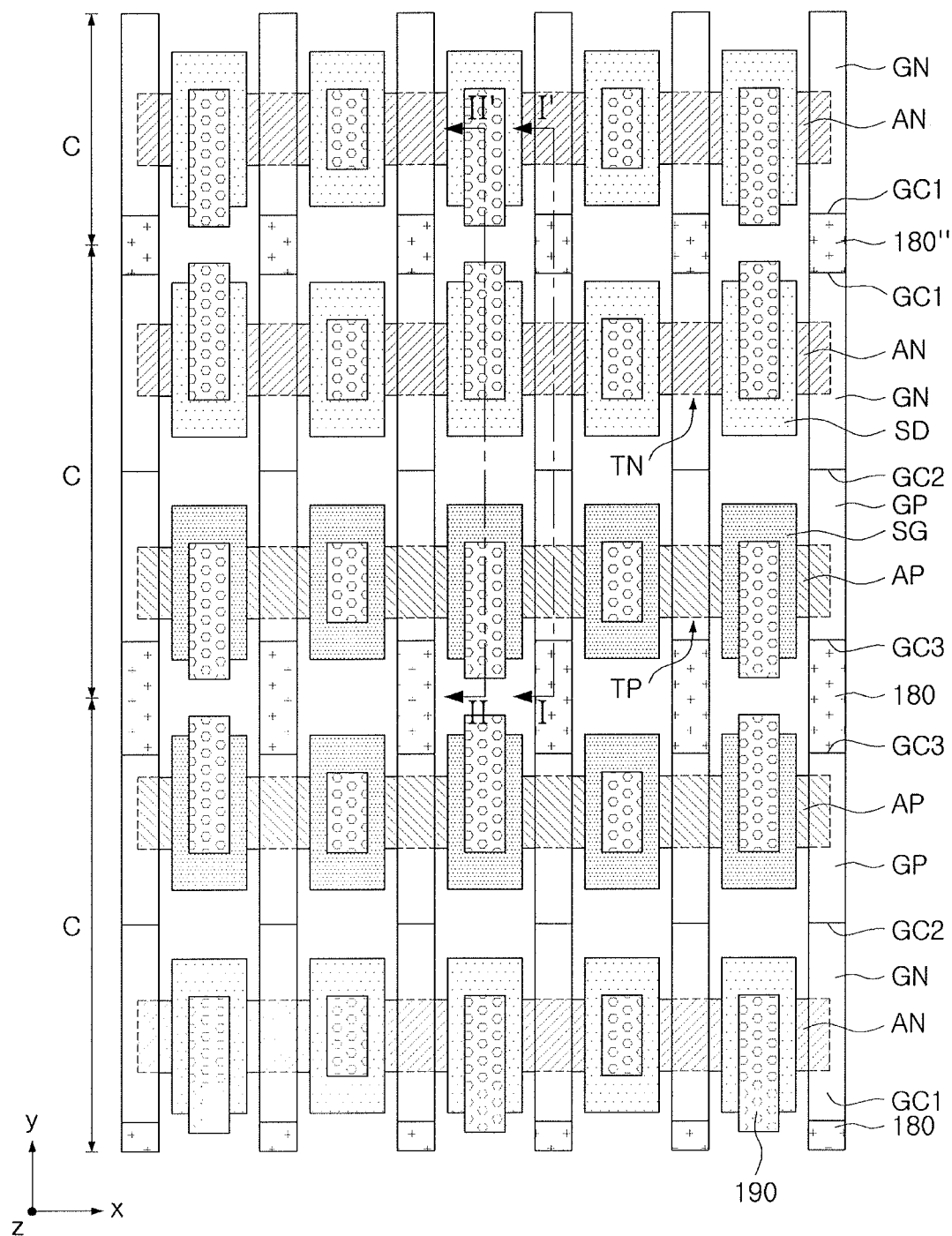
FIG. 14 illustrates a layout of a semiconductor device according to an example embodiment.
Figure 15:
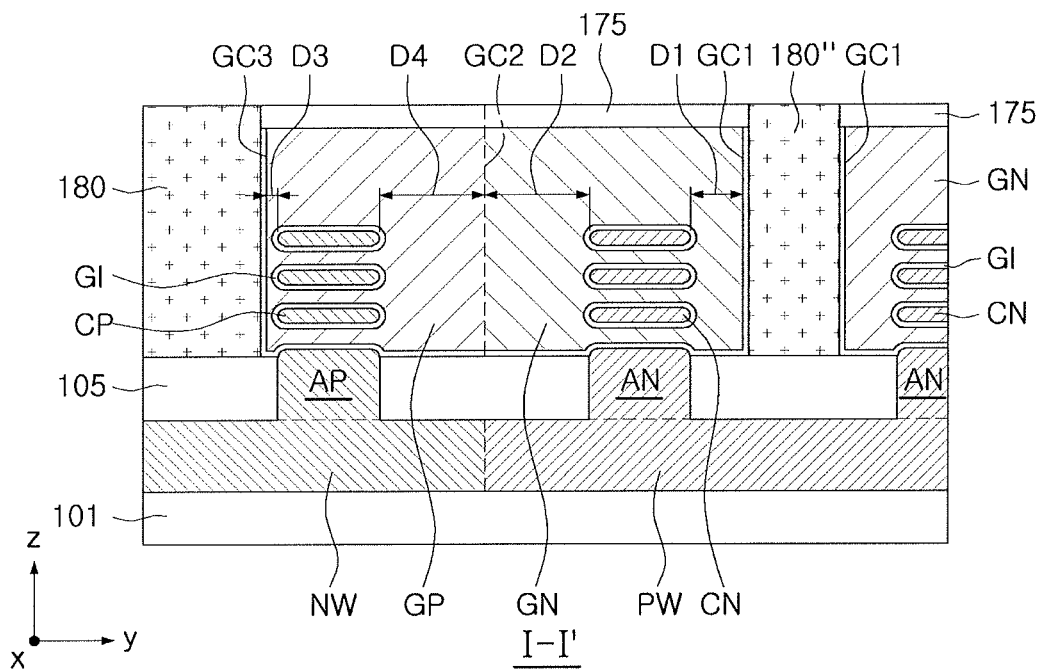
FIGS. 15 and 16 illustrate cross-sectional views of a semiconductor device according to an example embodiment.
Figure 16:
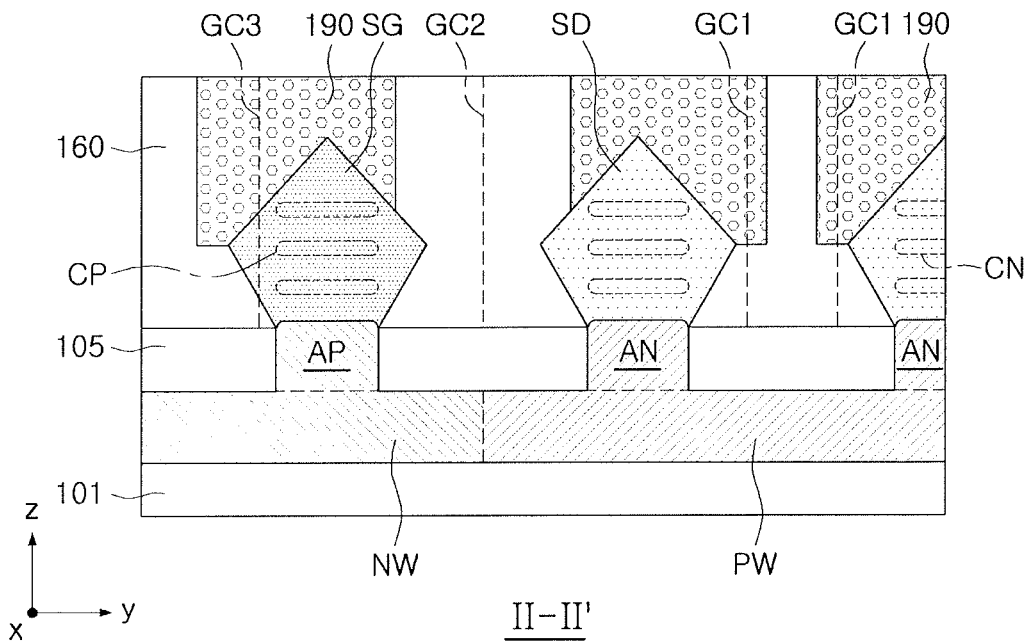

FIG. 14 is a layout of a semiconductor device according to an example embodiment. FIG. 15 is a cross-sectional view taken along line I-I' in FIG. 14, and FIG. 16 is a cross-sectional view taken along line II-II' in FIG. 14. Since the semiconductor device in FIGS. 14 to 16 is similar to the semiconductor device in FIGS. 1 to 4, detailed description of the same elements as those shown in FIGS. 1 to 4 will be omitted.

Referring to FIGS. 14 to 16, a semiconductor device according to an example embodiment may include gate isolation portions 180" disposed between the first gate electrodes GN, and gate isolation portions 180 disposed between the second gate electrodes GP in the second direction, e.g., the y direction. The gate isolation portion 180" may have a length shorter than a length of the gate isolation portion 180, in the second direction, e.g., the y direction. The first gate electrode GN may have a length greater than a length of the second gate electrode GP, in the second direction, e.g., the y direction.

Accordingly, the first distance D1 from the first end portion GC1 of the first gate electrode GN to the first side surfaces of first channel layers CN may not be equal to the third distance D3 from the third end portion GC3 of the second gate electrode to the third side surfaces of the second channel layers CP. The first distance D1 may be longer than the third distance D3. The third distance D3 may be less than half a width of each of the second channel layers CP in the second direction, e.g., the y direction. The third direction D3 is about 3 nm or less.

A portion of the second source/drain layer SG may protrude further than the third end portion GC3 of the second gate electrode GP, while the first source/drain layer SD may not protrude further than the first end portion GC1 of the first gate electrode GN. As illustrated in FIG. 14, the gate isolation portion 180 may horizontally overlap a portion of the second source/drain layer SG (as viewed in a top view), while the gate isolation portion 180" may not horizontally overlap the first source/drain layer SD (as viewed in a top view).

Figure 17:
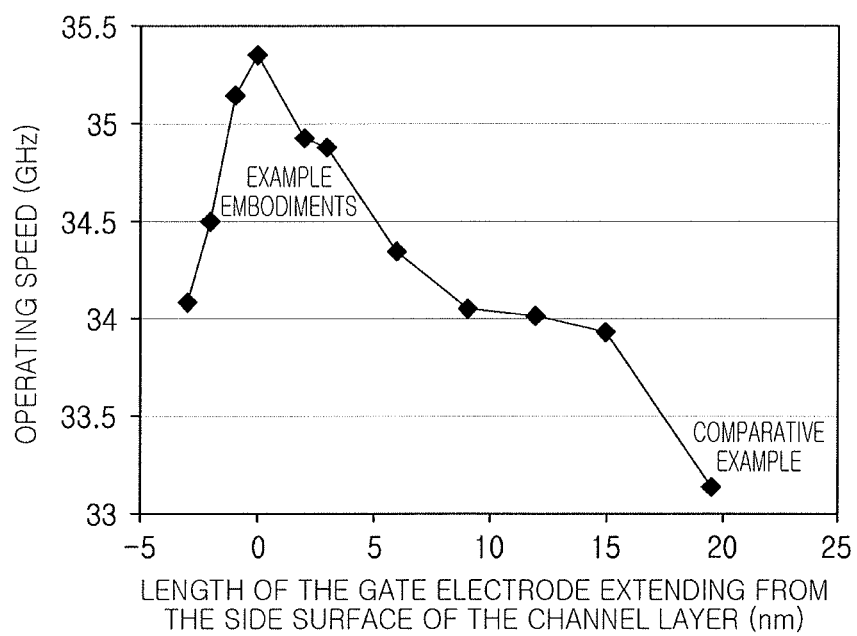
FIG. 17 illustrates a graph of a simulation result for example embodiments.

FIG. 17 is a graph showing a simulation result for example embodiments.

Referring to FIG. 17, in the case of example embodiments, it can be seen that a reduced length of a gate electrode extending from a side surface of a channel layer (nanosheet) causes a higher operating speed. For example, it can be seen that when the length of the gate electrode extending from the side surface of the channel layer is 0 nm, in a structure in which the side surface of the channel layer and an end portion of the gate electrode are aligned with each other, the operating speed is highest. In this case, the operating speed is improved by about 6 percent (%), compared with a comparative example. A decrease in parasitic capacitance results in the fact that a reduced length of a gate electrode extending from a side surface of a channel layer (nanosheet) increases an operating speed.

Then, it can be seen that when the length of the gate electrode extending from the side surface of the channel layer has a negative (minus) value, the operating speed is reduced again. The negative (minus) value of the extending gate electrode means a structure in which the side surface of the channel layer protrudes further than an end portion of the gate electrode. Since the gate electrode does not cover the side surface of the channel layer, leakage current caused by a short channel effect is increased to reduce the operating speed again.

As described above, in a semiconductor device according to an example embodiment, parasitic capacitance may be reduced and operating speed may be improved, thereby improved electrical characteristics. That is, a semiconductor device, e.g., a MBC-FET device, with a large nanosheet width (e.g., 10 nm or more) may have an asymmetric gate, e.g., when a gate does not extend further than a source/drain, thereby reducing parasitic capacitance. A skew between a gate edge and a channel edge may ranges from about (−3) nm to (+3) nm.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a plurality of channel layers stacked on a substrate, the plurality of channel layers being spaced apart from each other along a vertical direction, and having first side surfaces and second side surfaces opposing each other in a first direction;
   a gate electrode surrounding the plurality of channel layers, the gate electrode having a first end portion and a second end portion, opposing each other in the first direction; and
   a source/drain layer on a first side of the gate electrode and in contact with the plurality of channel layers, the source/drain layer being adjacent to the gate electrode along a second direction perpendicular to each of the first direction and the vertical direction, a portion of the source/drain layer protruding further than the first end portion of the gate electrode in the first direction,
   wherein a first distance from the first end portion of the gate electrode to the first side surfaces of the plurality of channel layers in the first direction is shorter than a second distance from the second end portion of the gate electrode to the second side surfaces of the plurality of channel layers in the first direction.

2. The semiconductor device as claimed in claim 1, wherein the first distance is less than half a width of each of the plurality of channel layers, in the first direction.

3. The semiconductor device as claimed in claim 1, wherein the first end portion of the gate electrode extends by the first distance beyond the first side surfaces of the plurality of channel layers and covers the first side surfaces of the plurality of channel layers, and the first distance is 3 nanometers or less.

4. The semiconductor device as claimed in claim 1, wherein the first side surfaces of the plurality of channel layers are aligned with the first end portion of the gate electrode.

5. The semiconductor device as claimed in claim 1, further comprising a gate isolation portion adjacent to the first end portion of the gate electrode along the first direction, an edge of the gate isolation portion being adjacent to and horizontally overlapping a portion of the source/drain layer along the second direction, as viewed in a top view.

6. The semiconductor device as claimed in claim 1, wherein the first side surfaces of the plurality of channel layers protrude further than the first end portion of the gate electrode.

7. The semiconductor device as claimed in claim 6, wherein the first side surfaces protruding further than the first end portion of the gate electrode have a curved surface.

8. The semiconductor device as claimed in claim 6, further comprising a gate isolation portion adjacent to the first end portion of the gate electrode, the gate isolation portion surrounding the first side surfaces of the plurality of channel layers.

9. The semiconductor device as claimed in claim 1, wherein:
the gate electrode includes a lower electrode portion and an upper electrode portion on the lower electrode portion, the upper electrode portion extending less than the lower electrode portion, and
the upper electrode portion is to cover a portion of an uppermost channel layer among the plurality of channel layers and the lower electrode portion is to cover parts of the plurality of channel layers other than the portion of the uppermost channel layer.

10. The semiconductor device as claimed in claim 9, wherein the first side surface of the uppermost channel layer protrudes further than the upper electrode portion of the gate electrode, a lower region of the first side surface of the uppermost channel layer being covered with the lower electrode portion.

11. The semiconductor device as claimed in claim 10, further comprising:
a gate isolation portion adjacent to the first end portion, wherein the gate isolation portion includes a lower layer and an upper layer on the lower layer, and
the upper layer has a length greater than a length of the lower layer in the first direction, and the upper layer of the gate isolation portion is in contact with the first side surface of the uppermost channel layer.

12. The semiconductor device as claimed in claim 1, wherein the first side surfaces of the plurality of channel layers are planes and protrude further than the first end portion of the gate electrode.

13. The semiconductor device as claimed in claim 12, further comprising a gate isolation portion adjacent to the first end portion, the gate isolation portion being in contact with the first side surfaces.

14. A semiconductor device, comprising:
a gate electrode on a substrate, the gate electrode having a first end portion and a second end portion, opposing each other in a first direction;
a plurality of nanosheets on the substrate to be spaced apart from each other along a vertical direction, the plurality of nanosheets penetrating the gate electrode and having first side surfaces and second side surfaces, opposing each other in the first direction;
a source/drain layer on a first side of the gate electrode to be in contact with the plurality of nanosheets, the source/drain layer being adjacent to the gate electrode along a second direction perpendicular to each of the first direction and the vertical direction, and a portion of the source/drain layer protruding further than the first end portion of the gate electrode in the first direction; and
a gate isolation portion adjacent to the first end portion of the gate electrode along the first direction, a portion of the gate isolation portion and a portion of the source/drain layer overlapping each other horizontally along the second direction, as viewed in a top view,
wherein a first distance from the first end portion of the gate electrode to the first side surfaces of the plurality of nanosheets in the first direction is shorter than a second distance from the second end portion of the gate electrode to the second side surfaces of the plurality of nanosheets in the first direction.

15. The semiconductor device as claimed in claim 14, wherein the first distance is less than half a width of each of the plurality of nanosheets, in the first direction.

16. The semiconductor device as claimed in claim 14, wherein the first end portion of the gate electrode is to cover the first side surfaces of the plurality of nanosheets, and the first distance is 3 nanometers or less.

17. The semiconductor device as claimed in claim 14, wherein the first side surfaces of the plurality of nanosheets protrude further than the first end portion of the gate electrode.

18. The semiconductor device as claimed in claim 17, wherein the gate isolation portion is in contact with the first side surfaces of the plurality of nanosheets.

19. A semiconductor device, comprising:
a first active region extending in a first direction;
a plurality of first channel layers stacked on the first active region to be spaced apart from each other along a vertical direction, the plurality of first channel layers having first side surfaces and second side surfaces, opposing the first side surfaces, in a second direction, perpendicular to each of the first direction and the vertical direction;
a first gate electrode to surround the plurality of first channel layers and having a first end portion and a second end portion, opposing each other, in the second direction;
a first source/drain layer on a first side of the first gate electrode to be in contact with the plurality of first channel layers, the first source/drain layer being adjacent to the first gate electrode along the first direction;
a second active region extending in the first direction;
a plurality of second channel layers on the second active region to be spaced apart from each other, the plurality of second channel layers having third side surfaces and fourth side surfaces, opposing each other, in the second direction;

a second gate electrode to surround the plurality of second channel layers and having a third end portion and a fourth end portion, opposing the third end portion, in the second direction; and a second source/drain layer on one side of the second gate electrode to be in contact with the plurality of second channel layers, the second source/drain layer being adjacent to the second gate electrode along the first direction, wherein at least a portion of the first source/drain layer protrudes further than the first end portion of the first gate electrode in the second direction, and at least a portion of the second source/drain layer protrudes further than the third end portion of the second gate electrode in the second direction.

20. The semiconductor device as claimed in claim 19, wherein in the second direction, a first distance from the first end portion of the first gate electrode to the first side surfaces of the plurality of first channel layers is shorter than a second distance from the second end portion of the first gate electrode to the second side surfaces of the plurality of first channel layers, and in the second direction, a third distance from the third end portion of the second gate electrode to the third side surfaces of the plurality of second channel layers is shorter than a fourth distance from the fourth end portion of the second gate electrode to the fourth side surfaces of the plurality of second channel layers.

* * * * *